United States Patent
Bhatt et al.

(10) Patent No.: US 6,386,890 B1
(45) Date of Patent: May 14, 2002

(54) PRINTED CIRCUIT BOARD TO MODULE MOUNTING AND INTERCONNECTING STRUCTURE AND METHOD

(75) Inventors: Anilkumar Chinuprasad Bhatt, Johnson City; William Louis Brodsky, Binghamton; Benson Chan, Vestal, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/804,529

(22) Filed: Mar. 12, 2001

(51) Int. Cl.$^7$ ............................ G01R 12/00; H05K 1/00
(52) U.S. Cl. ................................ 439/67; 439/66
(58) Field of Search ............................ 439/67, 66, 91, 439/591

(56) References Cited

U.S. PATENT DOCUMENTS

| | | | |
|---|---|---|---|
| 4,445,735 A | * 5/1984 | Bonnefoy | |
| 4,574,331 A | 3/1986 | Smolley | 361/393 |
| 4,581,679 A | 4/1986 | Smolley | 361/395 |
| 5,007,841 A | 4/1991 | Smolley | 439/66 |
| 5,222,014 A | 6/1993 | Lin | 361/414 |
| 5,315,481 A | 5/1994 | Smolley | 361/707 |
| 5,324,205 A | 6/1994 | Ahmad et al. | 439/66 |
| 5,473,510 A | * 12/1995 | Dozier, II | 361/719 |
| 5,598,033 A | 1/1997 | Behlen et al. | 257/686 |
| 5,704,794 A | 1/1998 | Lindeman | 739/66 |
| 5,810,607 A | 9/1998 | Shih et al. | 439/66 |
| 5,967,804 A | 10/1999 | Yoshizawa et al. | 439/91 |
| 5,990,563 A | 11/1999 | Kim | 257/778 |
| 6,007,349 A | 12/1999 | Distefano et al. | 439/71 |
| 6,264,476 B1 | * 7/2001 | Li et al. | 439/66 |

OTHER PUBLICATIONS

IBM Technical Disclosure Bulletin, vol. 37, Pub. No. 5, entitled "Flexible Power Connection for array Applications", May, 1994—2 pp.

* cited by examiner

Primary Examiner—Brian Sircus
Assistant Examiner—Chaudrika Prasad
(74) Attorney, Agent, or Firm—Patrick J. Daugherty; Driggs, Lucas, Brubaker & Hogg Co., LPA

(57) ABSTRACT

The present invention provides a method and structure for connecting a module to a printed circuit board, wherein a substantially rigid interposer having resilient conductors is disposed between a module and a printed circuit board. A clamping means urges the module and printed circuit board toward each other with compressive force upon an interposer positioned therebetween, preferably causing the module and printed circuit board to deform and thereby align their electrical contacts with the surfaces of the interposer. The interposer further comprises a plurality of apertures, each aperture further having a deformable resilient conductor means for connecting a module contact to a PCB contact. The conductor is deformable in shear, which may travel and, therefore, makeup the CTE dimensional mismatch between the module and the PCB. The conductors are detachable, electrically connecting the module and PCB contacts without the requirement of solder or other permanent means.

22 Claims, 2 Drawing Sheets

PRINTED CIRCUIT BOARD TO MODULE MOUNTING AND INTERCONNECTING STRUCTURE AND METHOD

FIELD OF THE INVENTION

The present invention relates to the mounting of electronic modules upon printed circuit boards and, more particularly, to a structure and method for mechanically and electrically connecting the module to the printed circuit board through a plurality of electrical contacts through normal contact force.

BACKGROUND OF INVENTION

In many computer and electronic circuit structures, an electronic module such as a Central Processor Unit (CPU), memory module or ASIC, must be connected to printed circuit board (hereinafter sometimes "PCB"). Modules come in a variety of sizes, and common connective dimension lengths are 32 mm, 42.5 mm and 90 mm. In connecting a module to a PCB, a plurality of individual electrical contacts on the base of the module must be connected to a set of a plurality of corresponding individual electrical contacts on the PCB. This set of contacts on the PCB dedicated to receiving the module contacts is known as a land grid array (hereinafter sometimes "LGA") site.

Today's printed circuit board and associated module circuit densities are so high that distances between contacts within an LGA site as small as 1 millimeter must be supported. In order to connect a module structurally and electrically to an LGA site on a PCB in a reliable fashion, a number of problems must be overcome. Two significant problems that must be addressed are (1) the initial alignment of the respective contacts; and (2) providing a reliable electrical connection between the module and PCB contacts that compensates for mismatches in coefficients of thermal expansion between the module components and the PCB substrate components.

With respect to the first problem, a land grid array site on a circuit board is typically formed by the lamination of a plurality of individual core members interconnected by plated through holes or power vias having upper surface contact areas. These upper surface contact areas are the contacts used to connect the PCB to the module contacts. The individual core members are typically planar epoxy glass dielectric cores having upper and lower surfaces, with a thin planar layer of copper deposed upon the upper and lower surfaces. The copper layers are featurized by etching or other subtractive means to form electrical circuits or power planes. When a copper layer is featurized as a power plane, a plurality of clearance holes or apertures are created through the copper layers and the epoxy substrate, and a plated through hole (PTH) is formed in each aperture to connect the upper and lower surface featurized copper layers and thereby carry an electric signal through the substrate. In laminating the power via apertures, a large amount of substrate material, such as an epoxy resin, is required to fill in all of the vacancies or apertures. Because of the amount of resin that is consumed filling the apertures, the resultant manufactured printed circuit board structure has a slight concave or "dish-down" configuration in the area defined by the LGA. Since the upper surfaces of the PCB contacts within the LGA conform to the dish-down shape of the PCB substrate, the LGA contact surfaces do not define a level planar configuration and, therefore, will not align with the planar alignment of a typical module contact array. In a typical PCB, the amount of LGA dish-down is from about 0.0015 inches to about 0.003 inches. What is needed is a way to deform the PCB upward in the LGA area of the board in order to remove this dish-down effect and bring the contacts into a level, planar configuration.

With respect to the second problem, module substrates carrying the connective contacts engaged by the PCB are typically fabricated from ceramic materials. The coefficient of thermal expansion (hereinafter sometimes "CTE") of ceramic modules typically ranges from 2 to 10 parts-per-million (ppm). This is much lower than that of a PCB fabricated from an epoxy resin substrate, which will typically have a CTE in the range of about 15 ppm through about 20 ppm. This thermal mismatch results in a shear-strain in the contact connections every time the module/PCB assembly heats up and cools down. The connections located at the corners of the module have the highest amount of shear strain, because they are the farthest from the neutral point at the center of the module; i.e., they have the largest distance to neutral point (DNP) value and, therefore, must withstand the largest displacement force during the heating and cooling cycles of the structure. The strain upon an individual contact connection is quantified by dividing the relative in-plane displacement between the module contact and the PCB contact by the height of the contact connection, also defined as the deformable length of the contact.

A typical prior art means of connecting the module contacts to the PCB contacts is to use solder. The solder is applied in a ball or columnar shape when hot and in a liquid state, and allowed to cool and solidify into a rigid permanent connection. Since the CTE mismatch strain upon an individual contact connection is dependent upon the height of the deformable length of the contact, a typical solder ball, which is about 0.03 inches in diameter, is less preferred than a solder column, which is typically 0.08 inches high. Solder columns accordingly support heating/cooling factor shear strains about three times greater than those supported by solder balls.

However, since solder connections are rigid and cannot move in response to thermal mismatch shear strains, multiple heating and cooling cycles can eventually cause solder connections to develop failures. This is true even in the case of the preferred solder column. Moreover, the application of solder to the contacts is problematic in preventing the solder from spreading outside of the contact areas and causing undesirable shorts between adjacent contacts. And lastly, since solder connections are permanent, they are not desirable for servicing modules by disconnection and replacement in the field. Field technicians do not have a means for disconnecting and reconnecting modules with solder. Therefore, rather than replace an individual defective module, large and more expensive sub-assemblies must be replaced.

Therefore, what is needed is a method and structure for reliably connecting a module to a printed circuit board that will deform the PCB upward and thereby align the PCB and module contacts. What is also needed is a method and structure that provides a reliable electrical connection between the module and PCB contacts that compensates for mismatches in coefficients of thermal expansion between the module components and the PCB substrate components. And lastly, it is also preferred that the method and structure enable quick assembly and disassembly of the module and PCB connection.

SUMMARY OF THE INVENTION

The present invention provides a method and structure for connecting a module to a printed circuit board, wherein a substantially rigid interposer having resilient conductors is disposed between a module and a printed circuit board. A clamping means urges the module and printed circuit board toward each other with compressive force upon an interposer positioned therebetween, preferably causing the module and printed circuit board to deform and thereby align their electrical contacts with the surfaces of the interposer. The interposer further comprises a plurality of apertures, each aperture further having a deformable resilient conductor means for connecting a module contact to a PCB contact. The conductor is deformable in shear, which may travel and, therefore, makeup the CTE dimensional mismatch between the module and the PCB. The conductors are detachable, electrically connecting the module and PCB contacts without the requirement of solder or other permanent means.

DETAILED DESCRIPTION OF THE INVENTION

Figure 1:
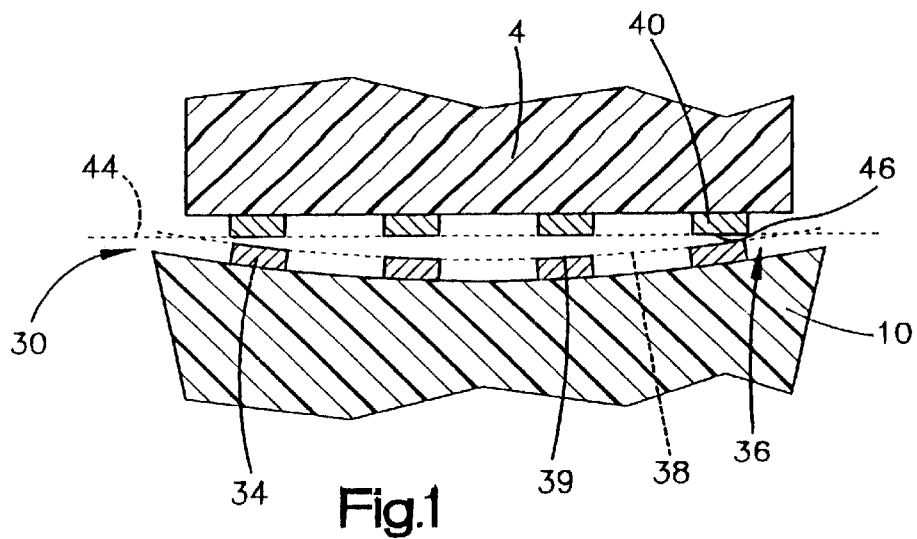
FIG. 1 is a side perspective view of the LGA array sites of a module and a PCB adaptable to the present invention.

Referring now to FIG. 1, a side view of an electronic module substrate 4 and a printed circuit board (PCB) 10 is illustrated, showing a land grid array (LGA) site 30 comprising PCB contacts 34 and corresponding module contacts 40. As is well known to those skilled in the art, a PCB 10 is typically formed by the lamination of a plurality of substrate cores (not shown) interconnected by plated through-holes (PTH's) formed in apertures (not shown) in the cores. Each PTH is in turn electrically connected to an upper surface contact area 34 (connection not shown). In laminating the cores, a large amount of substrate material, such as an epoxy resin, is required to fill in the apertures about the PTH's. Because of the amount of resin that is consumed filling the apertures, the upper surface 36 of the manufactured PCB structure has a slight concave or "dish-down" configuration in the area defined by the LGA site 30, relative to the planar interface area 44 defined by the engagement surfaces 46 of the contacts 40. This "dish-down" configuration is imparted to the PCB contact surface alignment 38, defined by the upper contact surfaces 39 of the PCB contacts 34. In a typical PCB, the amount of dish-down of the LGA contact engagement area 38 relative to the planar interface area 44 is from about 0.0015 inches to about 0.003 inches. Similarly, a typical module substrate 4 may have a contact surface alignment 46 that is warped due to manufacturing processes. Accordingly, if the module substrate 4 is assembled directly upon the PCB 10 with respective contacts 40 and 34 aligned, some contact 40 and 34 pairs will not be aligned into contact; this is especially true of those contacts 40 and 34 located toward the middle of the assembly and, therefore, at the point of greatest dish-down of the PCB 10. What is needed is a way to align and electrically connect all of the corresponding contacts 40 and 34.

Figure 2:
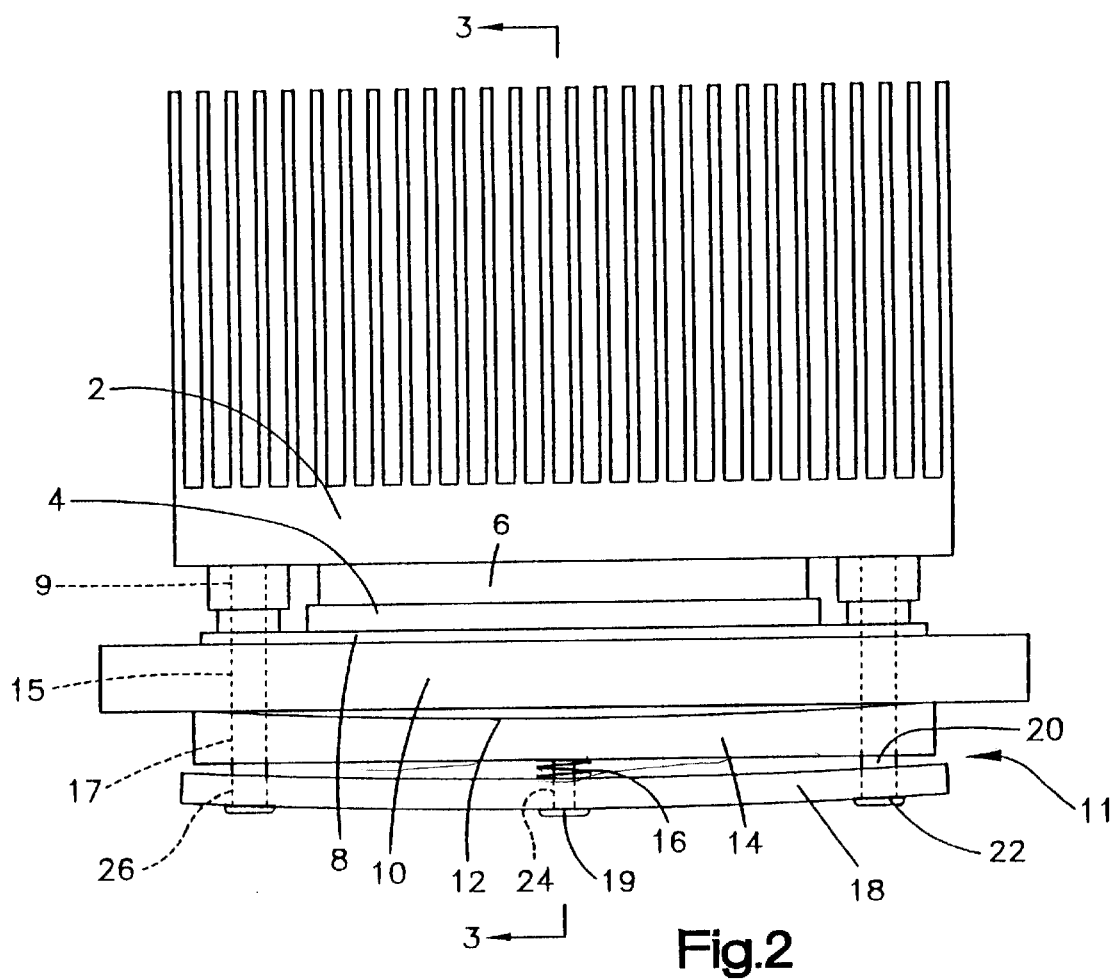
FIG. 2 is a side perspective view of an assembly of the module and PCB of FIG. 1 according to the present invention.

Referring now to FIG. 2, an assembly incorporating the module substrate 4 and PCB of FIG. 1 according to the present invention is shown. A rectilinear heat sink 2 is connected to a module cap 6, which is in turn connected to the module ceramic substrate 4; the heat sink 2 thereby provides heat transfer functions for the ceramic module substrate 4, as is well known in the art. An insulating spacer interposer 8 according to the present invention is disposed between the module substrate 4 and a printed circuit board (PCB) 10. A rigid insulator 12 is disposed along the bottom surface of the PCB 10 and has a thickness of from about 10 to about 30 thousands of an inch, more preferably about 30 thousands of inch, and is preferably fabricated from a fiberglass reinforced epoxy resin. The insulator 12 is urged upwards against the PCB 10, and the PCB 10 thereby upward towards the interposer 8 and module substrate 4, by a clamping means 11. In the embodiment shown in FIG. 2, the clamping means 11 comprises a stiffener 14, which is preferably a metal or steel plate. An upward force is generated by a spring 16, which directs force upward against the stiffener 14 through interaction with a spring-plate 18. It is preferred that the spring-plate 18 is a square structure with about the same overall width and depth as the heat sink 2. Four cylindrical posts 20 are connected at the four corners of the rectilinear heat sink 2 and disposed through cylindrical interposer post apertures 9, PCB post apertures 15 and stiffener post apertures 17, and through oblong spring plate post apertures 26. Post mushroom heads 22 are formed at the ends of the posts 20. The mushroom heads 22 rest against the spring plate 18 and thereby prevent the spring plate 18 from moving downward. Downward expansion or deflection forces from the spring 16 are exerted directly upon the spring plate 18, which translates the downward force to the mushroom heads 22, which translate the forces through the posts 20, the heat sink 2, the cap 6 into the module substrate 4, thereby forcing the module substrate 4 downward until the module contacts 40 come into contact with and exert force upon the rigid interposer 8. Similarly, force from the spring 16 is also exerted upwards by the spring 16 and translated through the stiffener 14 and the insulator 12 into the PCB 10, forcing the PCB 10 upwards until the PCB contacts 34 come into contact with and exert force upon the interposer 8. Accordingly, the PCB contacts 34 and module contacts 40 are forced toward each other with compressive forces upon the interposer 8 disposed therebetween.

The spring plate 18 also has a threaded screw 19 in the center of the spring 16. When the screw 19 is turned clockwise, its threads 21 travel along corresponding threaded grooves 25 in spring plate screw aperture 24 and, accordingly, the screw 19 moves upward toward and against the stiffener 14. As the screw 19 engages the stiffener 14 and exerts force upward against it, corresponding relational force is exerted by the screw threads 21 downward against the grooves 25 in the spring plate 18. As illustrated above in the discussion of the spring 16, the downward force exerted by the screw 19 is translated by the spring plate 18, mushroom heads 22, posts 20, the heat sink 2 and the cap 6 into the module substrate 4, thereby forcing the module substrate 4 downward until the module contacts 40 come into contact with and exert force against the rigid interposer 8. Similarly, upward force from the screw 19 is translated through the stiffener 14 and the insulator 12 into the PCB 10, forcing the PCB 10 upwards until the PCB contacts 34 come into contact and exert force against the interposer 8. Accordingly, after the screw 19 is rotated clockwise into contact with the stiffener 14, additional clockwise rotation of the screw 19 results in increasing compressive force exerted by the PCB contacts 34 and module contacts 40 upon the interposer 8 disposed therebetween.

Another embodiment of a clamping means (not shown), is a four-corner spring structure. In this structure, four separate spring and screw assemblies (not shown) are located at the four corners of the rectangular structure (not shown) for applying upward forces to a stiffener, rather than the central screw 19 and spring 16 assembly as shown and described above.

Figure 3:
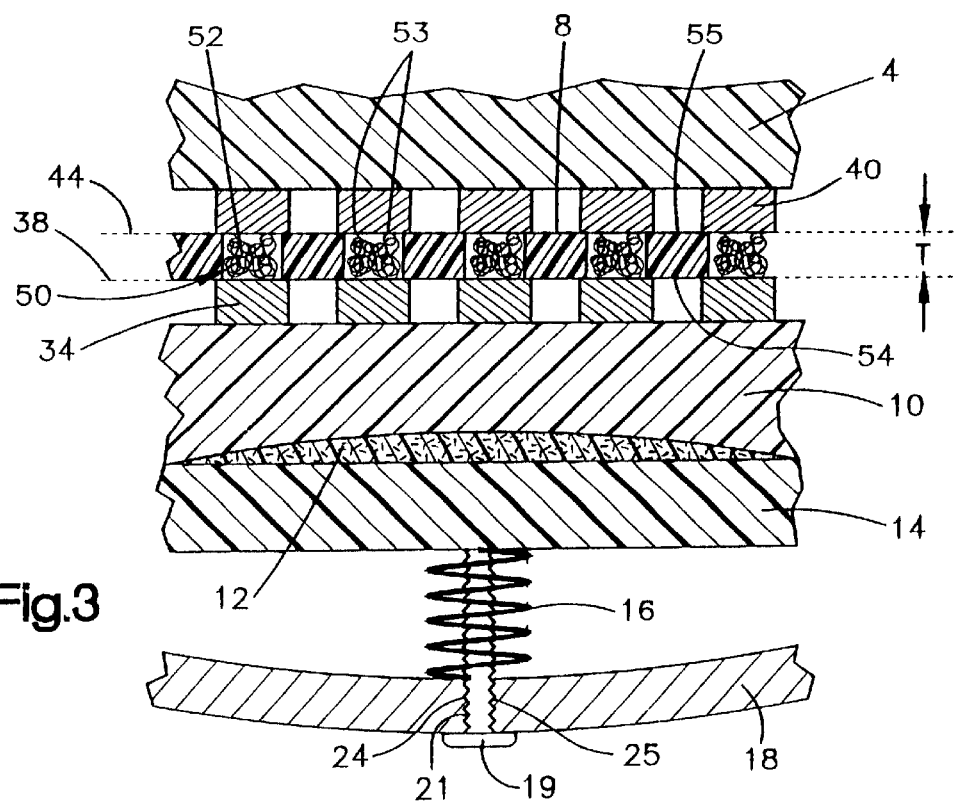
FIG. 3 is a partial sectional view of the module and PCB assembly of FIG. 2, taken along the section line indicated in FIG. 2.

Referring now to FIG. 3, a partial sectional side view of the assembly of FIG. 1 is shown. According to the present invention, the rigid interposer 8 has a plurality of apertures 50, each aperture 50 corresponding to one module contact 40 and one opposing PCB contact 34. Disposed within each aperture 50 is a resilient conductor 52. The conductor 52 has an inherent resilience that causes the conductor to expand upward and downward, and unrestrained the conductor 52 will expand to a height larger than that of the rigid interposer 8. Accordingly, when a module contact 40 is brought downward into contact with the interposer top surface 55 across an aperture 50, and an opposing PCB contact 34 is brought upward into contact the interposer bottom surface 54 across the same aperture 50, a conductor 52 disposed within the aperture 50 will be compressed into contact with the contacts 34 and 40 along multiple contact surfaces 53, resulting in an electrical connection between the contacts 34 and 40. Since the resilient conductor 52 is being forcibly compressed by the contacts 34 and 40, it exerts forces normal to the contacts 34 and 40.

One embodiment of the conductor 52 may be a "fuzzy button" connector similar to those produced by Cinch Inc. Alternatively, the conductor 52 may be a plated elastomeric member, a precious metal plated wire or a stamped metal contact with precious metal plating.

It is preferable that a precious metal wire having a random orientation be used for the conductor 52 to provide multiple contact points on the contacts 40 and 34, increasing the reliability of the overall electrical interconnection by providing multiple hertzian contacts. Another advantage of a "multiple contacts" conductor 52 is that it is better able to penetrate contamination films (not shown) which may be present upon module and PCB electrical contacts, when compared to a prior art "flat-on-flat" contact system (not shown).

For a precious metal wire or stamped metal contact with precious metal plating, texturing or providing a predetermined surface topography can provide multiple points of contact. In this way, an improved contact reliability, similar to the multiple Hertzian contacts of a random wire contact structure, is provided.

A further advantage of the module contact 40/conductor 52/PCB contact 34 assembly of the present invention is that the conductor 52 may elastically deform laterally in response to lateral movement of the module contact 40 relative to the PCB contact 34. This is important where the module substrate 4 and PCB 10 have divergent coefficients of thermal expansion (CTE). For example, where ceramic modules typically have CTE's ranging from 2 to 10 ppm, PCB fabricated from epoxy resin substrates typically have a CTE's ranging from about 15 to 20 ppm. Accordingly, when an assembly of a ceramic module substrate 4 and an epoxy resin substrate PCB 10 experiences heating and cooling cycles inherent in the operation of such an assembly, the divergent CTE's result in divergent rates of thermal expansion and contraction, and therefore divergent lateral rates of expansion and contraction with respect to the resilient conductor 52. Since a prior art solder column connection (not shown) is rigid, this thermal mismatch results in a shear-strain on fixed attachment points at the interfaces (not shown) between a prior art rigid solder column and module and PCB contacts every time a prior art module/solder connection/PCB assembly heats up and cools down. In contrast, the resilient conductor 52 according to the present invention may elastically deform laterally responsive to movement of the module substrate 4 relative to the PCB 10. This movement does not strain the compressive connection between the conductor 52 and the contacts 34 and 40 and, accordingly, repeated heating and cooling cycles will not cause the connection to develop fatigue failures, in contrast to a prior art solder connection. Also, due to multi point contact between the resilient conductor and module contact 40 or PCB contact 34, slippage of individual contact points does not create an electrical discontinuity. It is also important that expansion forces exerted normally upon a module contact 40 and a PCB contact 34 by a conductor 52 compressed therebetween are great enough to keep the multiple contact surfaces 53 of the conductor 52 firmly engaged in constant contact with the contacts 40 and 34 sufficient that the conductor surfaces 53 do not slide along the contacts 40 and 34 as said contacts 40 and 34 move relative to each other laterally; this ensures constant electrical connection between the conductor 52 and contacts 40 and 34. If the conductor contact surfaces 53 are instead allowed to slide along the surfaces of the contacts 40 and/or 34, then intermittent electrical failure may be experienced by the module contact 40/conductor 52/PCB contact 34 assembly when a single point contact interface occurs.

Another important feature of the present invention is that it overcomes the inherent misalignment of the PCB contacts 34 and module contacts 40 resulting from the "dish-down" alignment of the typical high-density LGA site PCB. As discussed earlier, a typical PCB 10 has an LGA contact surface "dish-down" geometry from about 0.0015 inches to about 0.003 inches; similarly, a typical module substrate 4 has a LGA contact surface alignment 46 that may be warped due to manufacturing processes. The present invention overcomes contact misalignment by urging the PCB 10 upward and conforming the PCB contact alignment 38 to interposer bottom surfaces alignment 54, and by urging the module substrate 4 downward and conforming the module contact alignment 46 to interposer upper surfaces alignment 55.

This realignment of the contacts 40 and 34 is achieved by the cooperative operation of the clamping means 11 elements, spring 16, screw 19, spring plate 18, stiffener 14, insulator 10, posts 20 and post mushroom heads 22, shown in FIGS. 2 and 3 and described above.

Although the embodiment thus described realigns the PCB contact surface alignment 38 in a substantially planar fashion, other alignments may be specified; for example the interposer bottom surfaces 54 may define convex or concave configurations.

Through its inherent resiliency, the conductor 52 provides its own force normal to the surface of the contacts 40 and 34. In the present invention, it is preferred that between about 30 and about 70 grams of normal force are exerted by each conductor 52 upon each contact 40 and 34, and it is further preferred to exert about 30 grams. Forces from the spring plate 18 urging the contacts 34 and 40 into contact with the conductor 52 may be greater than the sum of the normal forces of all of the conductors 52. Said excessive forces are then exerted against the interposer 8 surfaces 54 and 55 by the contacts 34 and 40, respectively, thereby providing a clamping force upon the interposer 8. By receiving the excess clamping force, the interposer 8 reduces the tolerance at which the spring plate 18 force must be set to achieve a specified normal conductor 52 contact force; all excess force is transmitted to the interposer 8 as compressive force. By receiving and absorbing the excess clamping forces, the interposer 8 maintains a uniform conductor 52 length, the thickness T of the interposer 8.

The interposer 8 typically engages between 800 and 5,000 contacts 34 each on the PCB 10 and module substrate 4. Accordingly, where a PCB 10 has between 1000 and 5000 contacts 34, in order to exert 70 grams upon each and every contact 34 and bring it into engagement with the rigid interposer 8, the sum of the forces applied equals between about 70,000 and about 350,000 grams, or between about 154 to about 770 pounds of force. In the present invention, the PCB 10 becomes flattened with the application of between 50 and 100 pounds of normal force and, therefore, any additional forces are urging the contacts into the interposer 8.

Once the contacts 34 and 40 are engaging the interposer 8, any additional force not applied against and compressing the conductor 52 is applied to the interposer 8. It is important that each of the contacts 34 and 40 exert compressive force upon the interposer 8 positioned therebetween. Accordingly, the clamping means 11 urges the contacts 40 and 34 towards each other with a force greater than the sum of all the expansion forces of the resilient conductors 52 engaged thereby. In this way, opposing normal forces are generated on the interposer 8 by the contacts 34 and 40 which provide an increased structural integrity resistant to disruptive vertical and horizontal forces. Horizontal integrity is increased by providing a frictional force at the interfaces of the contacts 40 and 34 with the interposer surfaces 55 and 54 respectively, which must be overcome to move the module substrate 4 laterally in shear relative to the PCB 10. As discussed above, an assembly of a ceramic module substrate 4 and an epoxy resin substrate PCB 10 experiences heating and cooling cycles inherent in the operation of such an assembly, and the divergent CTE's of the module substrate 4 and PCB 10 result in divergent rates of thermal expansion and contraction and, therefore, divergent lateral rates of expansion and contraction with respect to each other. Therefore, an important advantage of the present invention is a mechanical resistance to lateral movement of the module substrate 4 with respect to the PCB 10 responsive to heating and cooling cycles applied to the structure.

Vertical structural integrity is similarly enhanced. The resultant normal forces exceeding the expansion forces of the conductors 52 and exerted upon the interposer 8 by the contacts 34 and 40 resist changes in vertical alignment of the contacts 34 relative to the contacts 40 responsive to thermal cycling and vibration. As is well known in the art, during the electrical operation of a typical module substrate 4 and PCB 10 assembly, the module contacts 40 and PCB contacts 34 experience vertical deflections due to vibration of the assembly, and due to expansion and contraction from thermal cycling. Where unopposed vertical forces act upon contacts 34 or 40 and compel them in a direction away from the conductor 52, said vertical force will diminish the force exerted by the contact 34 or 40 upon the interposer 8 and then the conductor 52. By providing force to the contacts 34 and 40 normal to the conductor 52 and exceeding the outward compressive force of the conductor 52, the clamping means 11 provides force opposing for any diminishment caused by the vertical movement of the contacts 34 and 40 with respect to the conductor 52.

Another important advantage of the present invention is that the conductors 52 are not permanently attached to the contact surfaces 34 and 40. Instead, the electrical connections formed by the conductors 52 are pressure contact interfaces, which are field serviceable. This allows modules 4 to be rapidly disconnected from PCBs 10 and replaced, without requiring the disconnection and reconnection of a plurality of permanent electrical connections, such as solder connections that may be required in prior art module/PCB assemblies (not shown). Accordingly, it is preferable that the clamping means 11 is readily detachable and, therefore, the PCB 10 detachable from the module substrate 4.

Figure 4:
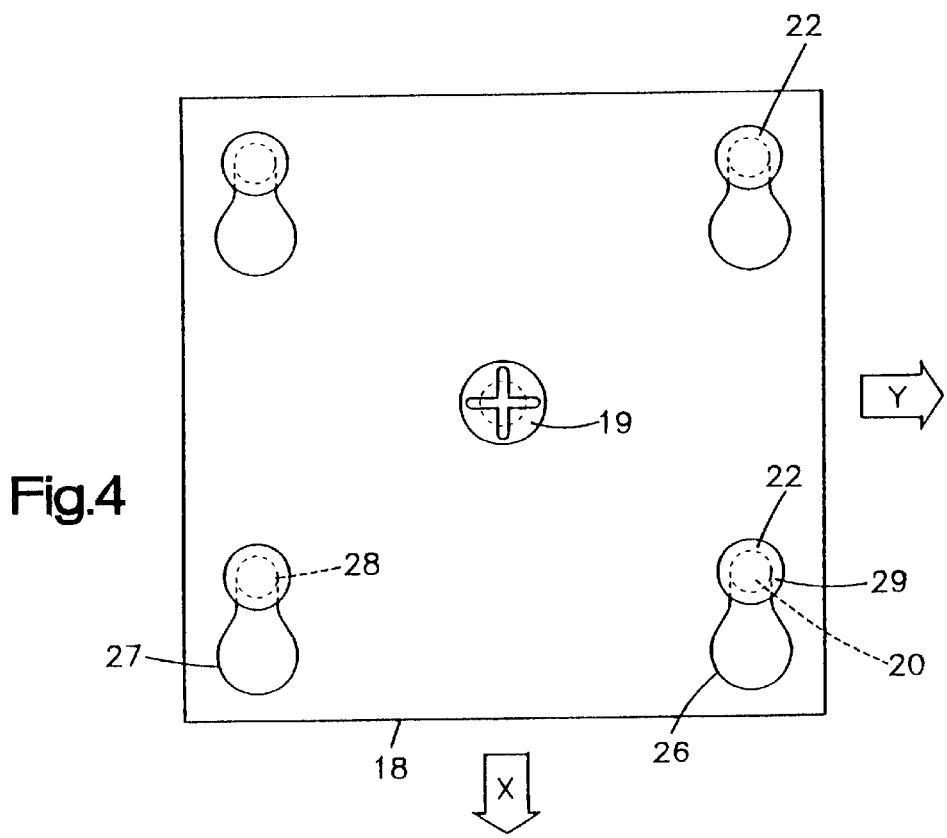
FIG. 4 is a bottom perspective view of the module and PCB assembly of FIGS. 2 and 3.

Referring now to FIG. 4, a bottom view of the spring plate 18 of FIGS. 2 and 3 is shown. Each oblong spring plate post aperture 26 has a circular large radius area 27 and an oblong small radius area 28. The small radius area 28 has a radius larger than the radius of the cylindrical posts 20 and smaller than the radius of the mushroom heads 22. In assembling the PCB 10/interposer 8/module substrate 4 assembly of the present invention, the posts 20 are aligned within the small radius areas 28 and the screw 19 is turned clockwise to engage the stiffener 14 and apply compressive forces to the assembly, as described above in this specification. Since the radius of the small radius area 28 is smaller than the radius of the mushroom heads 22, the mushroom heads 22 will engage the spring plate 18 about the small radius area 28 in an interface area 29. By turning the screw 19 clockwise after it has engaged the stiffener 14, additional force is applied to the mushroom head 22 and spring plate 18 interface 29, resulting in increased frictional forces that must be overcome in order to move the spring plate 18 laterally along the X or Y directions relative to the posts 20.

In order to disassemble the PCB 10/module 4 assembly, the screw 19 is rotated counter-clockwise, thereby rotating its threads in the grooves of the spring plate screw aperture 24 and causing the screw 19 to travel away from the stiffener 14 until the screw 19 is spaced from the stiffener 14. The spring plate 18 is then pushed upward toward the stiffener 14 along the posts 20, compressing the spring 16 and lifting the spring plate 18 off of the mushroom heads 22. The spring plate 18 may then be slid in the direction X until the mushroom heads 22 are aligned with the circular large radius area 27. The radius of the large radius area 27 is greater than the radius of the mushroom heads 22 and, accordingly, mushroom heads 22 may freely pass through the large areas 27. The radii of the cylindrical interposer post apertures 9, PCB post apertures 15 and stiffener post apertures 17 are all also larger than the mushroom head 22 radius. The spring plate 18, stiffener 14, insulator 12 and PCB 10 may now be slid off of the posts 20 and the assembly thus disassembled. In this way, the module substrate 4 may be rapidly detached from the PCB 10 and replaced with another (not shown). As is readily apparent, the ability to electrically and mechanically attach and detach modules from PCB's without the need for forming permanent connections between the two, such as forming and/or breaking permanent solder connections as required by prior art techniques (not shown), is a great advantage in time savings. Moreover, there is no danger of creating undesired connections between adjacent pad/conductor/contact assemblies from the seepage of solder from connection to connection.

While preferred embodiments of the invention has been described herein, variations in the design may be made, and such variations may be apparent to those skilled in the art of making tools, as well as to those skilled in other arts. The materials identified above are by no means the only materials suitable for the manufacture of the tool, and substitute materials will be readily apparent to one skilled in the art. The scope of the invention, therefore, is only to be limited by the following claims.

What is claimed is:

1. A printed circuit board to module mounting and interconnecting structure comprising:

a. a printed circuit board having a top surface;
b. a plurality of electrical contacts on said printed circuit board top surface;
c. an interposer having upper and lower surfaces; said interposer lower surface positioned on said printed circuit board electrical contacts;
d. said interposer further defining a plurality of apertures projecting from said upper surface to said lower surface, each of said apertures aligned with one of said contacts;
e. a module having a bottom surface, said bottom surface having a plurality of electrical pads, said pads positioned on said interposer upper surface, each pad aligned with one of said apertures;
f. a plurality of deformable resilient electrical conductors having top and bottom ends, each of said conductors disposed within one of said apertures with each said conductor top end pressing against one said aligned pad and each said conductor bottom end pressing against one said aligned contact, each of said conductors thereby compressed and exerting an upward normal force of at least about 30 grams against said pad and a downward normal force of at least about 30 grams against said contact, said conductor thereby electrically connecting said engaged pad to said engaged contact; and
g. a clamping means connected to said printed circuit board and said module, said clamping means applying force to said printed circuit board in an upward direction and thereby forcing said contacts against said conductor bottom ends and said interposer lower surface, said clamping means further applying force to said module in a downward direction and thereby forcing said pads against said conductor top end and said interposer upper surface;
wherein said conductor may deform laterally responsive to lateral movement of said printed circuit board relative: to said module and maintain the upward normal force of at least 30 grams and the downward normal force of at least 30 grams.

2. The structure of claim 1 wherein:
(a) the printed circuit board top surface has a first contour shape;
(b) the plurality of electrical contacts define a contact alignment contour responsive to said printed circuit board contour; and
(c) the interposer lower surface has a second contour shape;
(d) wherein the clamping means forces the printed circuit board top surface first contour shape to conform to said interposer lower surface second contour shape and thereby conform said contact alignment to said interposer lower surface second contour shape.

3. The structure of claim 1 wherein:
(a) the module bottom surface has a first contour shape;
(b) the plurality of electrical pads define a pad alignment contour responsive to said module bottom surface contour; and
(c) the interposer upper surface has a second contour shape;
wherein the clamping means forces the module lower surface first contour shape to conform to said interposer upper surface second contour shape and thereby conform said pad alignment to said interposer upper surface second contour shape.

4. The structure of claim 1 where in each of said apertures have a center axis, and each axis is spaced no more than about 1 mm from an adjacent axis.

5. The structure of claim 1 wherein said printed circuit board has a first coefficient of thermal expansion, said module has a second coefficient of thermal expansion.

6. The structure of claim 1 wherein the clamping means is adjustable to increase or decrease the upward and downward directional clamping means forces.

7. The structure of claim 1 wherein the clamping means is detachable and re-attachable, and the structure may therefore be disassembled and assembled.

8. The structure of claim 7 wherein the printed circuit board further has a lower surface, and the clamping means comprises:
(a) a rigid insulator having top and bottom surfaces, said insulator top surface disposed along said printed circuit board lower surface;
(b) a metal stiffener having top and bottom surfaces, said stiffener top surface disposed along insulator lower surface;
(c) a metal spring plate with a top side disposed against said spring bottom end, said plate further defining a threaded aperture; and
(d) a screw with first and second ends, said first end formed for engagement by a hand tool, said second end formed to engage said stiffener, said screw engaged by said threaded aperture and disposed within said spring with said second end engaging said stiffener;
wherein turning the screw clockwise increases the upward and downward direction forces applied by the clamping means, and turning the screw counter-clockwise reduces said forces.

9. The structure of claim 1 wherein the plurality of conductor top and bottom ends each have multiple hertzian contacts, the multiple contacts electrically engaging said aligned pads and contacts at multiple interface points.

10. The structure of claim 1 wherein each of the upward normal force and the downward normal force exerted by each of the plurality of conductors is between about 30 and about 70 grams of force.

11. A method for mounting and interconnecting a printed circuit board to a module, comprising the steps of:
a. providing a printed circuit board having a top surface with a plurality of electrical contacts;
b. providing an interposer having upper and lower surfaces and a plurality of apertures projecting from said upper surface to said lower surface;
c. providing a plurality of deformable resilient electrical conductors having top and bottom ends, each of said conductors disposed within one of said apertures, each of said top ends projecting above said interposer top surface and each of said bottom ends projecting below said interposer bottom surface
d. providing a module having a bottom surface with a plurality of electrical pads;
e. aligning the module, interposer aid printed circuit board wherein each aperture is positioned below one of the module pads and above one of the circuit board contacts;
f. providing a clamping means connected to said printed circuit board and said module;
g. clamping the interposer between the module and circuit board with the clamping means,
h. said clamping means forcing each of the circuit board contacts against said interposer lower surface about one of the apertures and each of the module pads against said interposer upper surface about one of the apertures;

i. each of the circuit board contacts and module pads thereby compressing one of the resilient conductors therebetween;

j. each of the compressed conductors exerting upward normal forces of at least 30 grams against each compressing pad, and downward normal forces of at least 30 grams against each compressing contact, and thereby electrically connecting the compressing pad and contact;

wherein said conductor may deform laterally responsive to lateral movement of said printed circuit board relative to said module and maintain the upward normal force of at least 30 grams and the downward normal force of at least 30 grams.

12. The method of claim 11 wherein:

(a) the printed circuit board top surface has a first contour shape;

(b) the plurality of electrical contacts define a contact alignment contour responsive to said printed circuit board contour; and (c) the interposer lower surface has a second contour shape;

(d) further comprising the step of the clamping means forcing the printed circuit board top surface first contour shape to conform to said interposer lower surface second contour shape and thereby conform said contact alignment to said interposer lower surface second contour shape.

13. The method of claim 11 wherein:

(a) the module bottom surface has a first contour shape;

(b) the plurality of electrical pads define a pad alignment contour responsive to said module bottom surface contour; and (c) the interposer upper surface has a second contour shape;

further comprising the step of the clamping means forcing the module lower surface first contour shape to conform to said interposer upper surface second contour shape and thereby conform said pad alignment to said interposer upper surface second contour shape.

14. The method of claim 11 wherein each of said apertures have a center axis, and each axis is spaced no more than about 1 mm from an adjacent axis.

15. The method of claim 11 wherein said printed circuit board has a first coefficient of thermal expansion, said module has a second coefficient of thermal expansion.

16. The method of claim 11, further comprising the step of adjusting the clamping means to increase or decrease the upward and downward directional clamping means forces.

17. The method of claim 16 wherein the clamping means is detachable and re-attachable, and the structure may therefore be disassembled and assembled.

18. The method of claim 17 wherein the printed circuit board further has a lower surface and the step of providing a clamping means further comprises:

(a) providing a rigid insulator having top and bottom surfaces, said insulator top surface disposed along said printed circuit board lower surface;

(b) providing a metal stiffener having top and bottom surfaces, said stiffener top surface disposed along insulator lower surface;

(c) providing a metal spring plate with a top side disposed against said spring bottom end, said plate further defining a threaded aperture; and (d) providing a screw with first and second ends, said first end formed for engagement by a hand tool, said second end formed to engage said stiffener, said screw engaged by said threaded aperture and disposed within said spring with said second end engaging said stiffener;

(e) turning the screw clockwise to increase the upward and downward direction forces applied by the clamping means; and (f) turning the screw counter-clockwise to decrease the upward and downward direction forces applied by the clamping means.

19. The method of claim 11, further comprising the steps of:

providing multiple hertzian contacts at the top and bottom ends of each of the plurality of conductor;

a. electrically engaging said aligned pads and contacts at multiple interface points with the multiple hertzian contacts.

20. The method of claim 11 wherein each of the upward normal forces and the downward normal forces exerted by each of the plurality of conductors is between about 30 and about 70 grams of force.

21. The structure of claim 5 wherein the first coefficient of thermal expansion is more than about 15 ppm and the second coefficient of thermal expansion is less than about 10 ppm.

22. The method of claim 15 wherein the first coefficient of thermal expansion is more than about 15 ppm and the second coefficient of thermal expansion is less than about 10 ppm.

* * * * *